United States Patent
Mittelholzer et al.

(10) Patent No.: US 9,588,702 B2
(45) Date of Patent: Mar. 7, 2017

(54) ADAPTING ERASE CYCLE PARAMETERS TO PROMOTE ENDURANCE OF A MEMORY

(71) Applicant: INTERNATIONAL BUSINESS MACHINES CORPORATION, Armonk, NY (US)

(72) Inventors: Thomas Mittelholzer, Zurich (CH); Nikolaos Papandreou, Thalwil (CH); Thomas Parnell, Zurich (CH); Charalampos Pozidis, Thalwil (CH); Gary A. Tressler, Sand Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/585,689

(22) Filed: Dec. 30, 2014

(65) Prior Publication Data
US 2016/0188231 A1    Jun. 30, 2016

(51) Int. Cl.
G11C 11/34 (2006.01)
G06F 3/06 (2006.01)
G11C 16/34 (2006.01)
G06F 11/10 (2006.01)
(Continued)

(52) U.S. Cl.
CPC .......... *G06F 3/0619* (2013.01); *G06F 3/0655* (2013.01); *G06F 3/0688* (2013.01);
(Continued)

(58) Field of Classification Search
CPC .. G06F 3/0619; G06F 11/1072; G06F 11/076; G06F 3/0688; G06F 3/0655; G11C 16/3495
See application file for complete search history.

(56) References Cited

U.S. PATENT DOCUMENTS 9,152,555 B2 *  10/2015  Higgins ................ G11C 16/16
                                                                365/51
2010/0208523 A1    8/2010  Marquart
(Continued)

FOREIGN PATENT DOCUMENTS

WO          03001530 A2     1/2003
WO       2008077125 A1      6/2008
(Continued)

OTHER PUBLICATIONS

Hatanaka, Teruyoshi, et al; "A negative word-line voltage negatively-incremental erase pulse scheme with $\Delta VTH=1/6\Delta VERASE$ for enterprise solid-state drive application ferroelectric-NAND flash memories", Japanese Journal of Applied Physics 49, No. 4S (2010): Downloaded May 8, 2014.
(Continued)

*Primary Examiner* — Pho M Luu
*Assistant Examiner* — Mohammed A Bashar
(74) *Attorney, Agent, or Firm* — Brian F. Russell; Randall J. Bluestone

(57) ABSTRACT

In a data storage system including a non-volatile memory array, a controller repeatedly determines at least one health metric of the non-volatile memory array during an operating lifetime of the non-volatile memory array. In response to determining the at least one health metric, the controller selectively varies an erase parameter of the non-volatile memory array over the operating lifetime of the non-volatile memory array, such that endurance of the non-volatile memory array is improved.

25 Claims, 12 Drawing Sheets

(51) Int. Cl.
*G06F 11/07* (2006.01)
*G11C 16/14* (2006.01)

(52) U.S. Cl.
CPC ........ *G06F 11/076* (2013.01); *G06F 11/1072* (2013.01); *G11C 16/14* (2013.01); *G11C 16/3445* (2013.01); *G11C 16/3495* (2013.01); *G06F 11/108* (2013.01)

(56) References Cited

U.S. PATENT DOCUMENTS

| | | |
|---|---|---|
| 2010/0265775 A1 | 10/2010 | Chang et al. |
| 2011/0242899 A1 | 10/2011 | Oowada et al. |
| 2013/0279257 A1 | 10/2013 | Costa et al. |
| 2014/0204678 A1 | 7/2014 | Mu et al. |

FOREIGN PATENT DOCUMENTS

| | | |
|---|---|---|
| WO | 2011008367 A1 | 1/2011 |
| WO | 2013181101 A2 | 12/2013 |

OTHER PUBLICATIONS

Berman, Amit, and Uri C. Weiser, "Reliable Architecture for Flash Memory". Department of Electrical Engineering, Technion—Israel Institute of Technology: Downloaded Jul. 29, 2009.

Micheloni, Rino, et al; "High-capacity NAND flash memories: XLC storage and single-die 3D", In Memory Mass Storage, pp. 289-334. Springer Berlin Heidelberg, 2011.

\* cited by examiner

ADAPTING ERASE CYCLE PARAMETERS TO PROMOTE ENDURANCE OF A MEMORY

BACKGROUND OF THE INVENTION

This disclosure relates to data processing and storage, and more specifically, to controlling erase cycle parameters in a data storage system, such as a flash memory system, to promote endurance.

NAND flash memory is an electrically programmable and erasable non-volatile memory technology that stores one or more bits of data per memory cell as a charge on the floating gate of a transistor. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays can generally be programmed on a page basis, but are erased on a block basis.

A NAND flash memory cell can be programmed by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge.

A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses continue to be applied to the erase block until the erase verify operation succeeds or until a predetermined number of erase pulses have been used (i.e., the erase pulse budget is exhausted). In the prior art, the design philosophy has been to set the default erase pulse budget to a fairly high number in order to limit the number of memory cells that are not driven to the erased state and to thus minimize the bit errors attributable to unsuccessfully erased memory cells.

BRIEF SUMMARY

As a NAND flash memory wears over time, more erase pulses are generally required during the erase process in order to successfully erase an erase block. The increase in the number of erase pulses employed during an erase cycle raises endurance concerns because the wear experienced by a NAND flash memory device is caused to a large extent by the erase process itself, which tends to degrade the gate oxide of the floating gates of the transistors forming the memory cells of the erase block.

The present disclosure recognizes that it would be desirable to control erase cycle parameters in a data storage system, such as a NAND flash memory system, to promote endurance. The erase cycle parameters can include, for example, the number of erase pulses employed, as well as the amplitude and/or duration of the erase pulses, the read voltage threshold utilized to verify erasure, and/or the number of memory cells permitted to fail the erase verify operation.

In at least one embodiment, a controller of a non-volatile memory array, such as a flash memory array, repeatedly determines at least one health metric of the non-volatile memory array during an operating lifetime of the non-volatile memory array. In response to determining the at least one health metric, the controller selectively varies an erase parameter over the operating lifetime of the non-volatile memory array, such that endurance of the non-volatile memory array is improved.

DETAILED DESCRIPTION

Figure 1A:
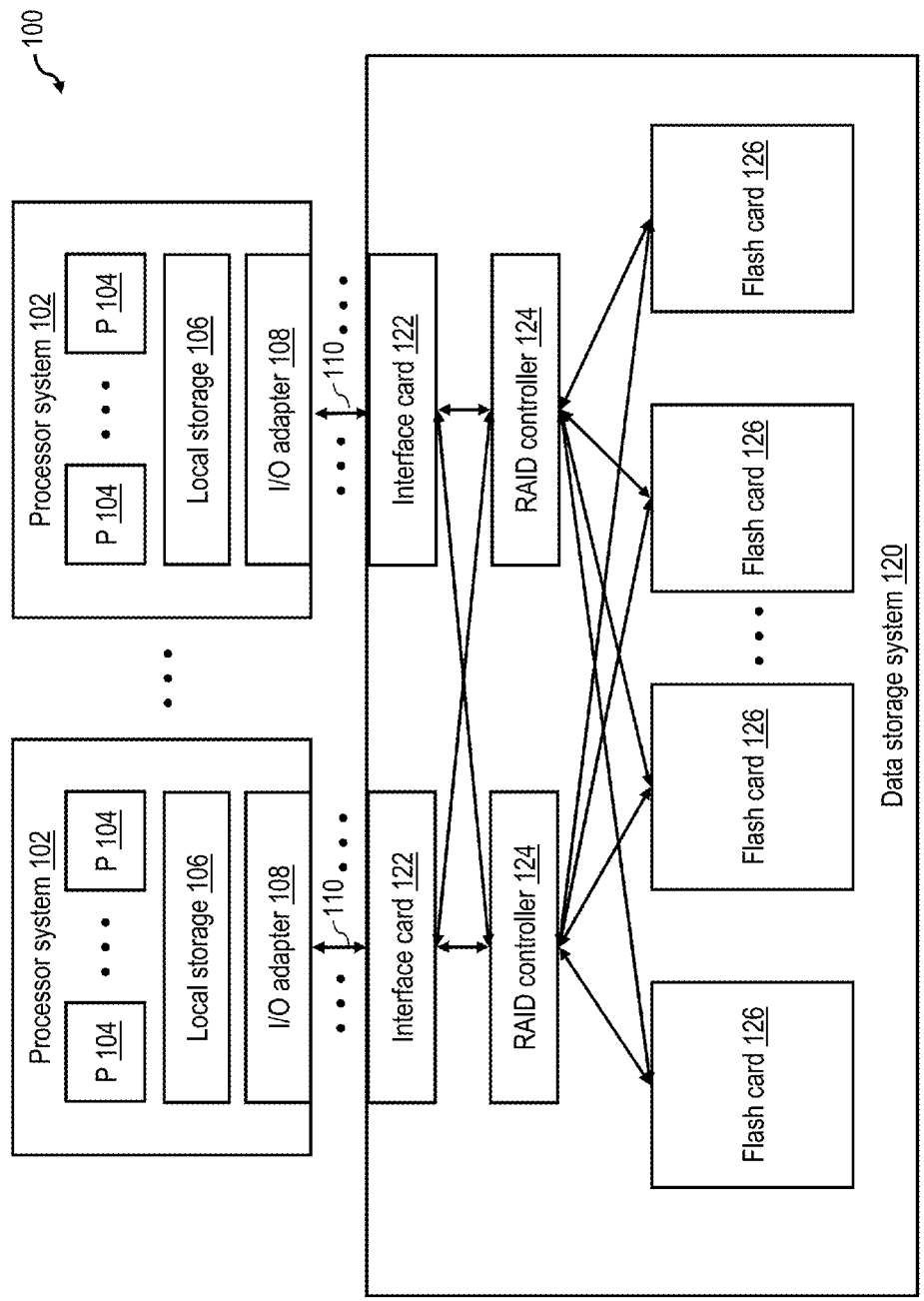
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. Processor system 102 can also be an embedded processor system using various processors such as ARM, PowerPC, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel may employ any one or a combination of known or future developed communication protocols, including, for example, Fibre Channel (FC), FC over Ethernet (FCoE), Internet Small Computer System Interface (iSCSI), Infini-Band, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

Although not required, in the illustrated embodiment, data storage system 120 includes multiple interface cards 122 through which data storage system 120 receives and responds to input/output operations (IOP) 102 via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, other storage media can be employed.

Figure 1B:
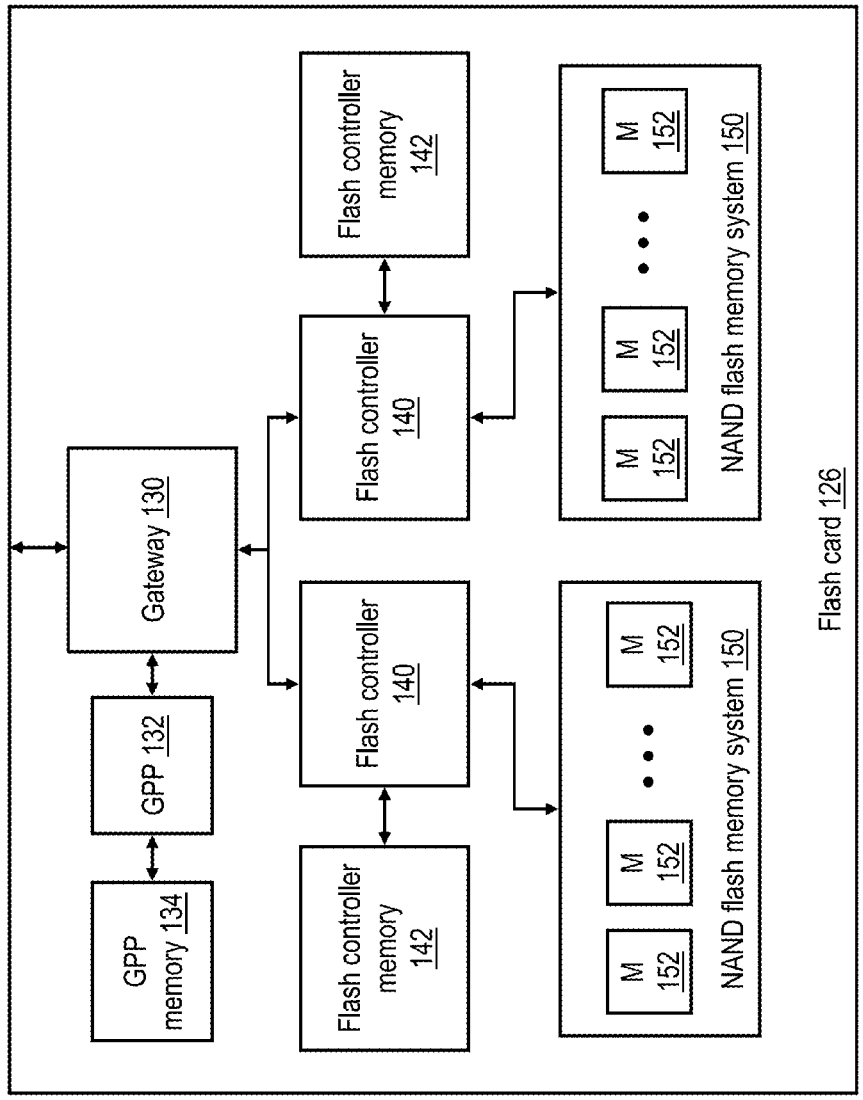
FIG. 1B is a more detailed block diagram of a flash card of the data storage system of FIG. 1A.

FIG. 1B depicts a more detailed block diagram of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on IOPs received by gateway 130 and/or to schedule servicing of the IOPs by flash card 126. GPP 132 is coupled to a GPP memory 134 (e.g., Dynamic Random Access Memory (DRAM)) that can conveniently buffer data created, referenced and/or modified by GPP 132 in the course of its processing.

Gateway 130 is further coupled to multiple flash controllers 140, each of which controls a respective NAND flash memory system 150. Flash controllers 140 can be implemented, for example, by an Application Specific Integrated Circuit (ASIC) or Field Programmable Gate Array (FPGA)) having an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs into a physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. As shown in FIG. 1B, each NAND flash memory system 150 may include multiple (e.g., 32) individually addressable NAND flash memory storage devices 152. In the illustrated example, the flash memory storage devices take the form of a board-mounted flash memory modules, for example, Single Level Cell (SLC), Multi-Level Cell (MLC), Three Level Cell (TLC), or Quad Level Cell (QLC) NAND flash memory modules.

Figure 2:
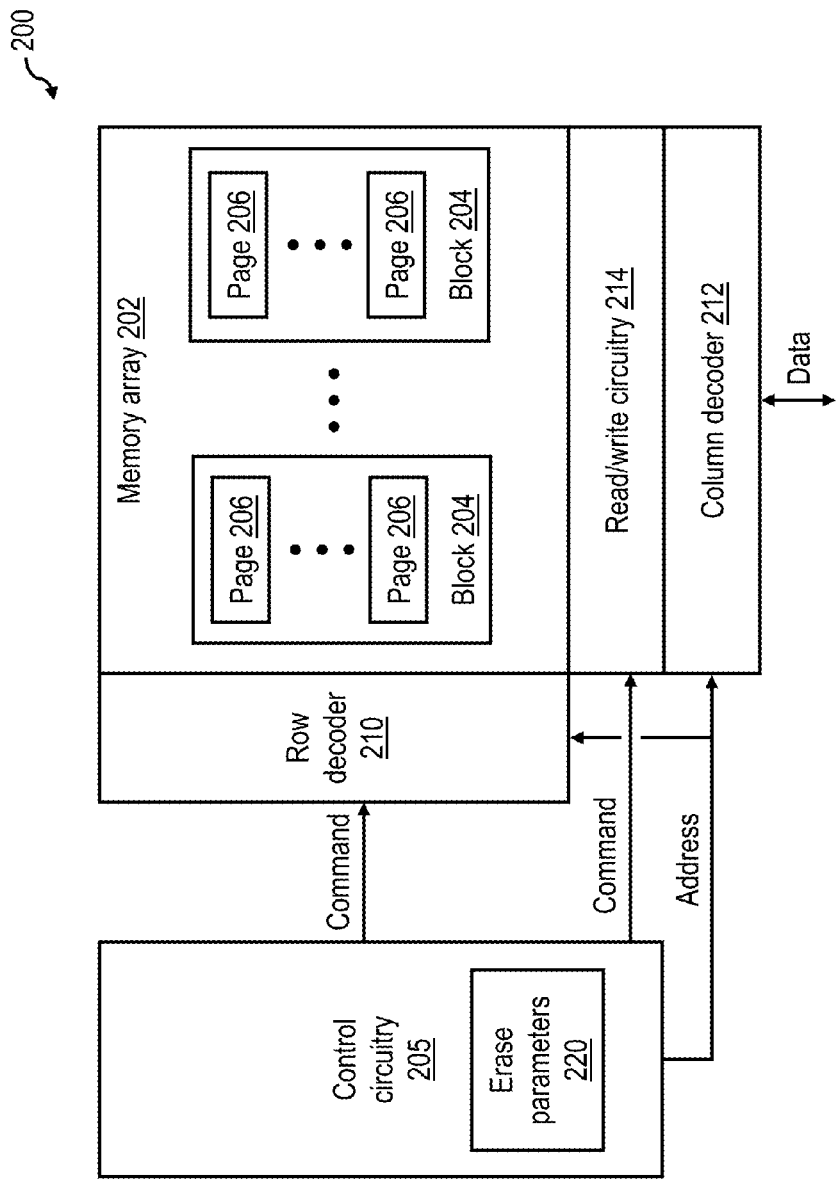
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two- or three-dimensional array of NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory is generally constrained by its construction such that the smallest granule of storage that can be erased is a block 204 and the smallest granule of storage that can be accessed by a read or write IOP is fixed at the size of a single physical page 206. It should be appreciated in this regard that the LBAs provided by host devices correspond to logical pages within a logical address space, where each logical page typically has a size of 4 kilobytes. Physical pages 206, in contrast, typically have a larger size, for example, 16 kilobytes (kB), and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202. As described further herein, control circuitry 205 performs erase operations in accordance with dynamically adjustable erase parameters 220, which may be determined, for example, by control circuitry 205 and/or the associated flash controller 140. In various embodiments, erase parameters 220, which can be independently set and maintained for each block 204 (or groups of blocks 204) can include, for example, one or more of a set including a number of erase pulses that are allowed to be utilized in erasing a block 204 (defined herein as an erase pulse budget), the amplitudes and durations of erase pulses, the erase verify voltage used to verify erasure of memory cells, and the erase verify cell count threshold that determines how many memory cells can have a gate voltage that does not meet the erase verify threshold and still have the block erase operation succeed.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices to directly address and/or access the physical memory locations within NAND flash memory systems 150. Instead, data storage system 120 is generally configured to present a single contiguous logical address space to the external devices, thus allowing host devices to read and write data to and from LBAs within the logical address space while permitting flash controllers 140 and GPP 132 to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 manages the logical-to-physical translation using a logical-to-physical translation data structure, such as logical-to-physical translation (LPT) table 300, which can be stored in the associated flash controller memory 142.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 132 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write IOP received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that it is no longer valid. In addition, data placement function 310 allocates a page stripe if necessary to store the write data of the write IOP and any non-updated data (i.e., in case the write request is smaller than a logical page, there is still valid data which needs to be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read IOPs by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 updates LPT table 300 to remove the current association between the logical and physical addresses of the data. In addition, relocation function 314 issues relocation write requests to data placement function 310 to request that the data of the old block stripe be written to a new block stripe in NAND flash memory system 150. Once all still valid data has been moved from the old block stripe, the old block stripe is passed to dissolve block stripes function 316, which decomposes the old block stripe into its constituent blocks, thus disassociating the blocks. Each of the blocks formerly forming the dissolved block stripe is then erased under the direction of flash controller 140 and/or the control circuitry 205 of the relevant flash memory module 200, and a corresponding program/erase (P/E) cycle count for each erased block is incremented. Based on the health metrics of each erased block (e.g., bit error rate (BER) metrics, uncorrectable errors, P/E cycle count, etc.), each erased block is either retired (i.e., withdrawn from use) by a block retirement function 318 among the flash management functions executed on GPP 132, or alternatively, prepared for reuse by placing the block on the appropriate ready-to-use (RTU) queue 306 in the associated GPP memory 134.

Figure 3:
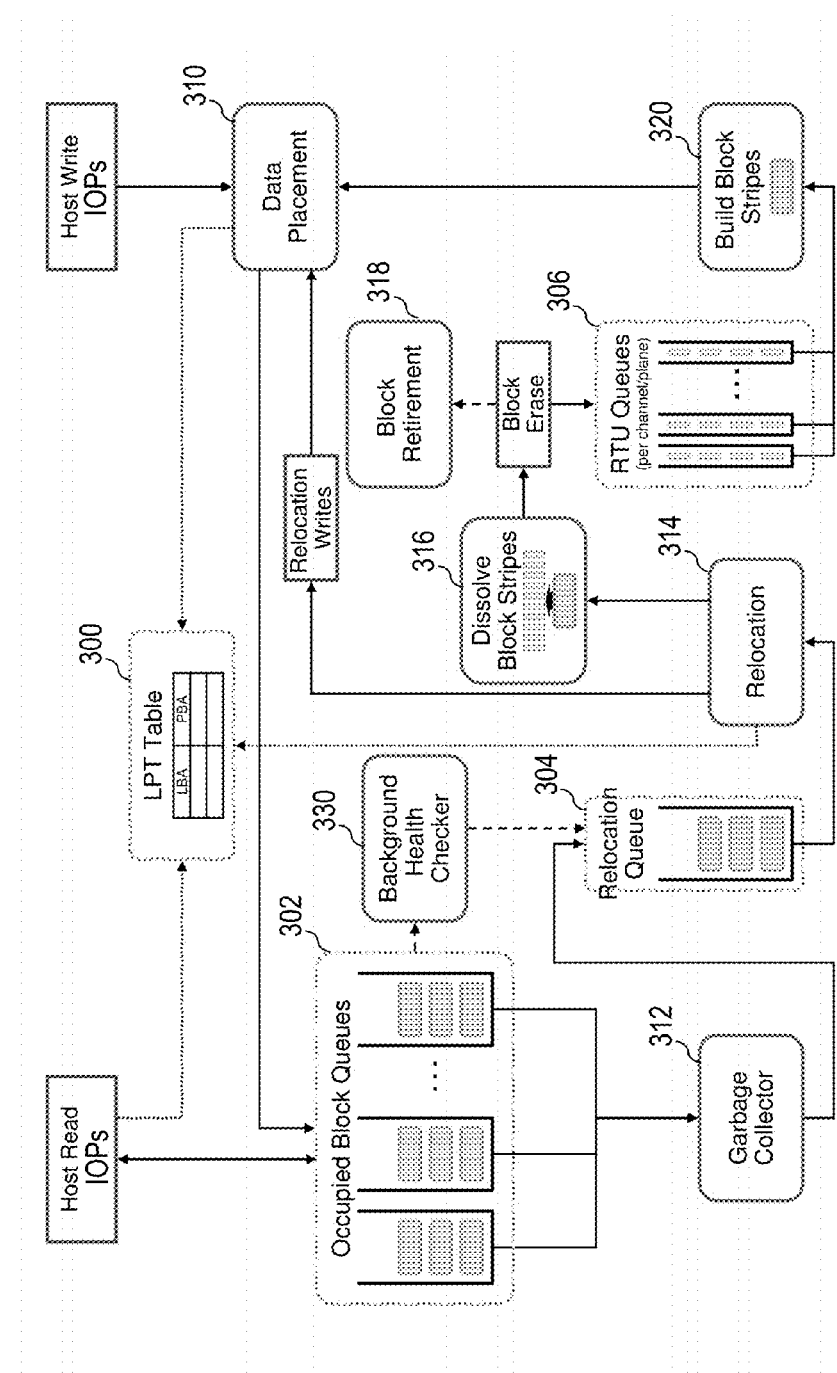
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the demand read and write IOPs of hosts such as processor systems 102, continuously determines one or more metrics of health for blocks belonging to block stripes recorded in occupied block queues 302. Based on the one or more of the health metrics, background health checker 330 places block stripes on relocation queue 304 for handling by relocation function 314. Key health metrics preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc.

Figure 5:
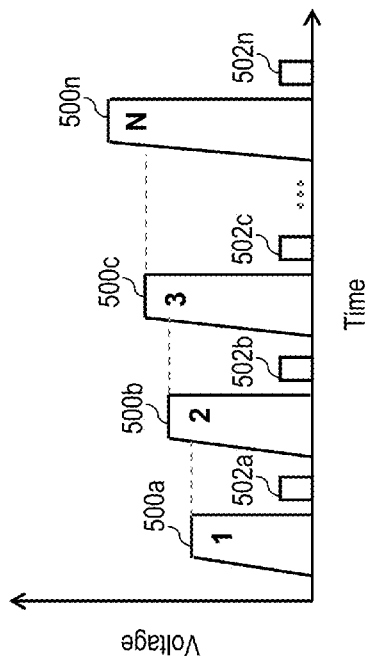
FIG. 5 depicts a train of erase pulses employed in an erase process in accordance with one embodiment.
Figure 4:
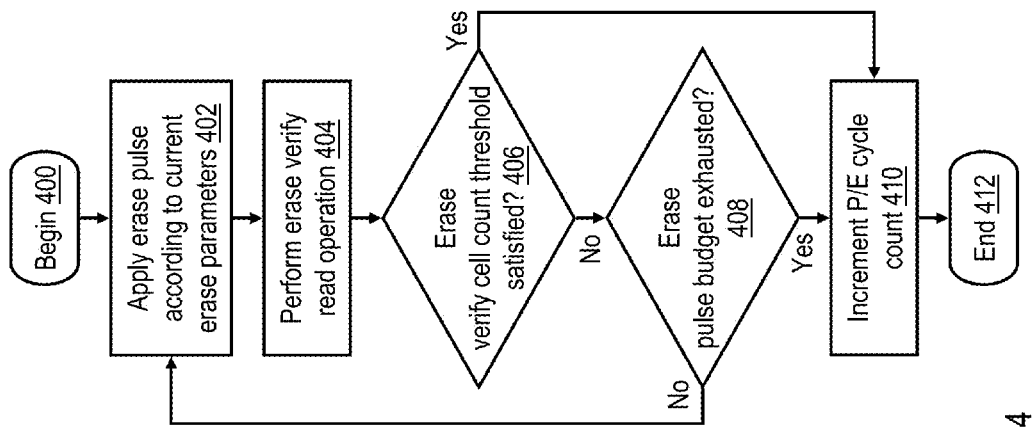
FIG. 4 is a high level logical flowchart of an exemplary process for erasing a block of NAND flash memory in accordance with one embodiment.

Referring now to FIG. 4, there is depicted a high level logical flowchart of an exemplary process for erasing a block of NAND flash memory in accordance with one embodiment. The illustrated erase process can be performed, for example, by the control circuitry 205 of a flash memory module 200 under the direction of a flash controller 140 and/or GPP 132. Aspects of the erase process of FIG. 4 are described below with further reference to FIG. 5, which illustrates a train of erase pulses and erase verify pulses employed in an erase process in accordance with one embodiment, and to FIG. 6, which is graph showing an exemplary distribution of threshold voltages sensed from a target block of memory cells in response to an erase verify.

Figure 6:
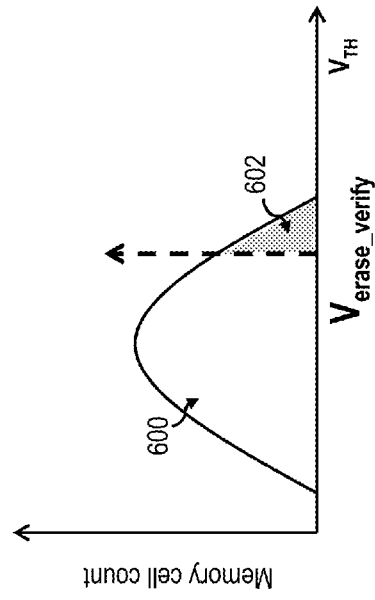
FIG. 6 is a graph showing an exemplary distribution of threshold voltages sensed from a target block of memory cells in response to an erase verify operation in accordance with one embodiment.

The erase process of FIG. 4 begins at block 400, for example, in response to control circuitry 205 receiving from the associated flash controller 140 a command to erase a specified target block 204 in its memory array 202. The process proceeds from block 400 to block 402, which illustrates control circuitry 205 applying a first erase pulse 500a to the target block in accordance with the current erase parameters 220. Thus, control circuitry 205 applies a first erase pulse 500a having the voltage amplitude and duration specified by erase parameters 220. As indicated at block 404, control circuitry 205 follows first erase pulse 500a with an erase verify pulse 502a, which initiates a read operation that determines the threshold voltages ($V_{TH}$) of the memory cells comprising the target block and thus indicates whether the memory cells are in a programmed or erased state. As indicated in FIG. 6, the threshold voltages of the memory cells generally have a distribution in which a first portion 600 of the memory cells have a threshold voltage less than an erase verify voltage (and are thus in an erased state) and a second portion 602 of the memory cells have a threshold voltage greater than the erase verify voltage (and thus remain in a programmed state).

At block 406 of FIG. 4, control circuitry 205 determines whether an erase verify cell count threshold specified by erase parameters 220 is satisfied. For example, in one embodiment, control circuitry 205 determines whether the second portion 602 of memory cells includes fewer memory cells than the erase verify cell count threshold. In response to a determination at block 406 that the erase verify cell count threshold is satisfied, the process of FIG. 4 proceeds to block 410, which is described below. However, in response to a determination at block 406 that the erase verify cell count threshold is not satisfied, control circuitry 205 determines at block 408 whether or not the current erase pulse budget specified in erase parameters 220 has been exhausted.

In response to control circuitry 205 determining at block 408 that the erase pulse budget has not been exhausted, the erase process of FIG. 4 returns to block 402 and following blocks. When the process returns to block 402, control circuitry 205 applies a second erase pulse 500b to the target memory block in accordance with the current erase parameters 220. As indicated in FIG. 4, erase parameters 220 typically specify that each successive erase pulse within a given erase process has a greater amplitude than the previous erase pulse. Thus, control circuitry 205 continues to apply erase pulses 500a, 500b, 500c, . . . , 500n and corresponding erase verify pulses 502a, 502b, 502c, . . . , 502n to the target block 204 of the memory array 202 until either the erase verify cell count threshold is satisfied at block 406 or the current erase pulse budget is exhausted (i.e., a number (N) of erase pulses have been applied to the target block 204). It should be noted that an erase cycle may thus use fewer erase pulses than permitted by the current erase pulse budget. Following an affirmative determination at either block 406 or block 408, the process passes to block 410, which illustrates control circuitry 205 incrementing a program/erase (P/E) cycle count for the target block 204. The P/E cycle count may be maintained, for example, as a portion of erase parameters 220 and/or by the associated flash controller 140 in flash controller memory 142. Thereafter, the erase process of FIG. 4 ends at block 412.

Figure 7:
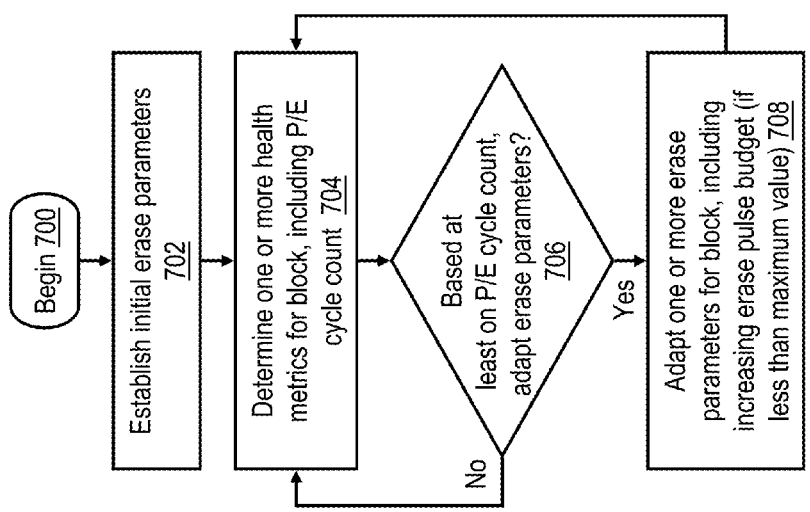
FIG. 7 is a high level logical flowchart of an exemplary process for adapting one of more erase parameters based on at least program/erase (P/E) cycle count in accordance with one embodiment.

With reference now to FIG. 7, there is illustrated a high level logical flowchart of an exemplary process for adapting one of more erase parameters including an erase pulse budget based on at least a P/E cycle count in accordance with one embodiment. The illustrated process can be performed, for example, by a flash controller 140 and/or GPP 132 on a per-block basis. For ease of exposition, it is hereafter assumed that the process given in FIG. 7 is performed by flash controller 140.

The process of FIG. 7 begins at block 700 and thereafter proceeds to block 702, which illustrates flash controller 140 establishing initial per-block erase parameters 220 for each flash memory module 200 under its control, for example, at system initialization. As noted above, the initial per-block erase parameters can include one or more of a set including the erase pulse budget, the amplitudes and durations of the individual erase pulses in the erase pulse budget, the erase verify voltage, and the erase verify cell count threshold. In general, in the prior art, erase parameters are set to fixed manufacturer-specified defaults designed to minimize the BER. According to the present invention, the erase parameters are instead set to promote enhanced endurance while maintaining an acceptable BER. Consequently, at block 702, flash controller 140 preferably sets the initial erase parameters to provide a more "gentle" erase cycle, for example, by establishing an erase pulse budget that is lower than the manufacturer-specified default, lower than default erase pulse amplitudes, a higher than default erase verify voltage threshold, and/or a higher than default erase verify cell count threshold. As employed herein, a more gentle erase cycle is defined herein as one that impart relatively less wear to the physical structure of the memory cells comprising the target block undergoing the erase cycle.

Following block 702, flash controller 140 selectively adapts one or more erase parameters 220 of a block based on at least a P/E cycle count for the block as shown at blocks 704-708 of FIG. 7. In at least one embodiment, flash controller 140 can implement these steps as part of background health checker process 330 of FIG. 3. Referring in particular to block 704, flash controller 140 determines one or more health metrics for a block. The health metrics may include, for example, the P/E cycle count for the block, as well as one or more BER metrics, such as the worst (i.e., highest) page BER of the block, the mean page BER of the block, and the rates of change of the worst page BER and mean page BER of the block. At block 706, flash controller 140 determines whether, based at least on the P/E cycle count of the block and optionally based on one or more additional health metrics of the block, the erase parameters should be adapted. For example, given the typical BER characteristics of the particular flash memory modules 200 selected for NAND flash memory systems 150 over the range of P/E cycle counts of an expected device lifetime, flash controller 140 can predetermine multiple triggering P/E cycle counts at which flash controller 140 updates (i.e., increases) the erase pulse budget of a block in order to maintain a selected BER metric (e.g., a worst page BER) under a desired upper BER threshold (e.g., the threshold of ECC correctability). In this example, at block 706 flash controller 140 determines whether to adapt at least the erase pulse budget for a block based on whether the next triggering P/E cycle count has been reached.

In response to determining at block 706 to adapt erase parameters 220 for a block, flash controller 140 adapts one or more erase parameters for the block (block 708). In addition to increasing the erase pulse budget, flash controller 140 may also adapt the erase pulse amplitudes for future erase pulses, the erase verify voltage threshold, and/or the default erase verify cell count threshold. In general, the policy employed by flash controller 140 preferably implements a more "gentle" erase cycle (in terms of wear) early in the life of the flash module at the expense of greater BERs and thereafter adjusts the erase parameters to maintain at least one selected BER metric within desired bounds. Following block 708, the process returns to block 704 and following blocks, which have been described.

Figure 8:
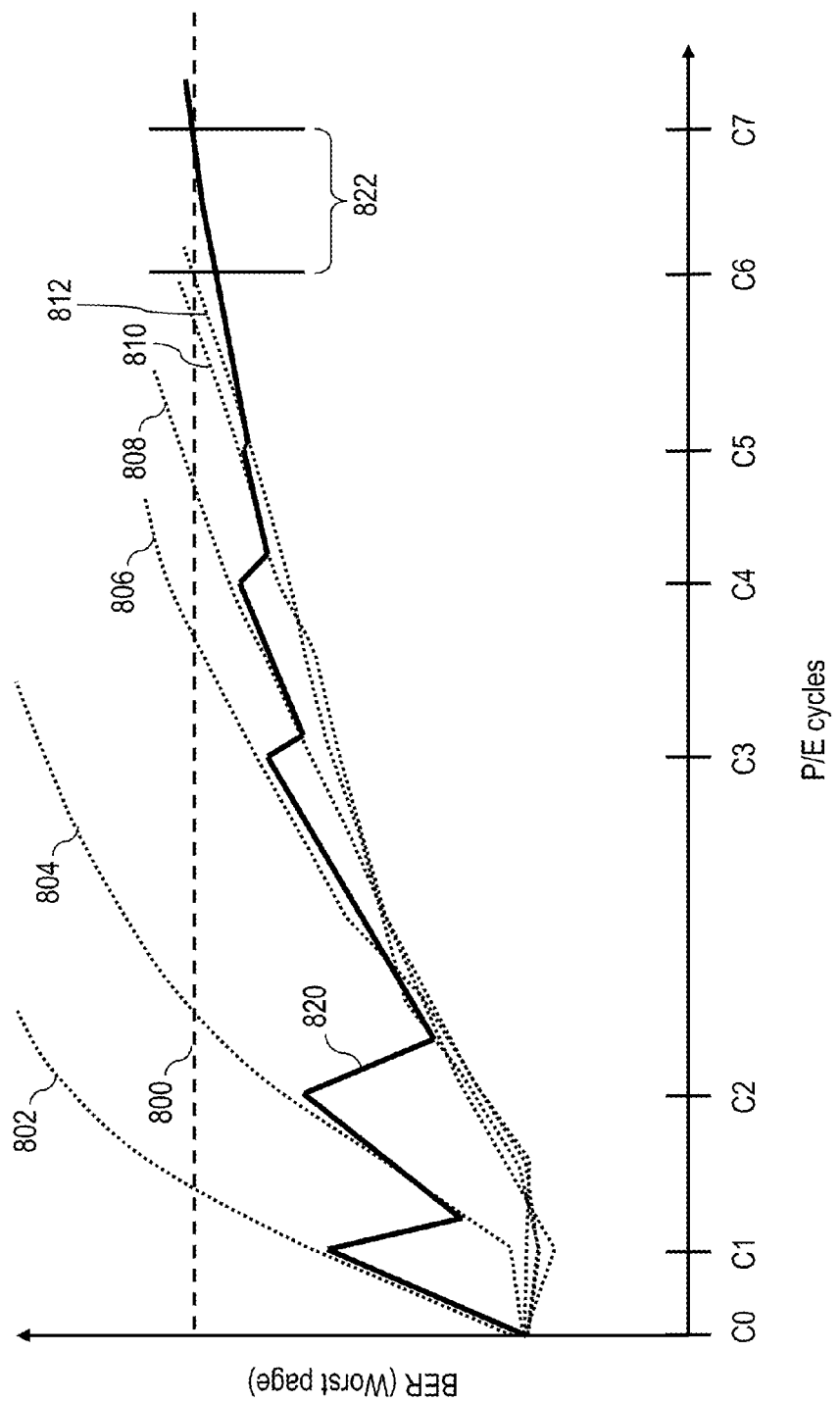
FIG. 8 is a graph depicting the endurance gain achieved in an exemplary NAND flash memory system by adapting one or more erase parameters based on P/E cycle count in accordance with one embodiment.

FIG. 8 is a graph depicting the endurance gain achieved in an exemplary NAND flash memory system by adapting an erase pulse budget based on P/E cycle count in accordance with one embodiment. FIG. 8 represents P/E cycle count along the X-axis and a selected BER metric for a block (in this case worst page BER) along the Y-axis. A similar graph would be obtained for other BER metrics, such as mean page BER.

At reference numeral 800 of FIG. 8, a desired upper BER threshold is illustrated. As noted above, this upper BER threshold 800 can represent, for example, the maximum number of bit errors that can be corrected by the ECC implemented by an exemplary flash memory module. Thus, the triggering P/E cycle counts at which flash controller 140 updates (i.e., increases) the erase pulse budget of a block in the method of FIG. 7 are preferably selected to maintain the BER metric (in this case, the worst page BER) under upper BER threshold 800.

FIG. 8 further includes a plurality of curves 802-812 of the worst page BERs obtained for a block of the exemplary model of flash memory module for various fixed erase pulse budgets. In particular, curves 802-812 indicates the worst page BER for fixed erase pulse budgets of 2, 4, 6, 8, 10 and 12, respectively. Thus, each of curves 802-812 indicates the expected worst page BER for a block if the erase pulse budget were fixed at the corresponding value for the lifetime of the flash memory module. As can be seen by comparison of curves 802 and 812, which correspond to erase pulse budgets of 2 and 12, respectively, use of a lower fixed erase pulse budget generally yields a relatively higher worst page BER that crosses upper BER threshold 800 at a lower P/E cycle count. Because crossing upper BER threshold 800 can correspond to the block becoming unusable, use of a lower fixed erase pulse budget is regarded in the prior art as resulting in a lower block (and device) endurance in terms of P/E cycles. Consequently, it is common in the prior art to employ a high fixed erase pulse budget (e.g., between 12 and 16).

In contrast to the prior art, the method of FIG. 7 described above adapts erase parameters, including at least the erase pulse budget, based on at least the P/E cycle count. For example, FIG. 8 illustrates that the flash controller 140 initializing the erase pulse budget of a block prior to or at P/E cycle count C0 to the value of 2. The worst page BER of the block thereafter varies approximately with the P/E cycle count according to curve 802. Flash controller 140 then adapts the erase pulse budget at triggering P/E cycle count C1 by increasing the erase pulse budget from 2 to 4. Consequently, the worst page BER of the block begins to approximately track curve 804 until triggering P/E cycle count C2 is reached. In response to reaching triggering P/E cycle count C2, flash controller 140 adapts the erase pulse budget of the block by increasing the erase pulse budget from 4 to 6. As indicated in FIG. 8, the process shown in FIG. 7 continues to adapt the erase pulse budget of the block to 8 at P/E cycle count C3, to 10 at P/E cycle count C4, and to 12 at P/E cycle count C5. Assuming in this example that the maximum possible erase pulse budget is 12, flash controller 140 preferably does not adapt the erase pulse budget after the maximum possible erase pulse budget is reached.

Although use of an adaptive erase pulse budget results in a higher initial BER metric than use of a high fixed erase pulse budget (e.g., 12), the reduced wear on the block attributable to the use of fewer total erase pulses results in a substantial improvement in the endurance of the block. For example, FIG. 8 illustrates that the worst page BER corresponding to use of a fixed erase pulse budget of 12 crosses upper BER threshold 800 at P/E cycle count C6, while the worst page BER obtained by adaptive control of the erase pulse budget does not cross upper BER threshold 800 until cycle C7, resulting in an substantial endurance gain 822.

Figure 9:
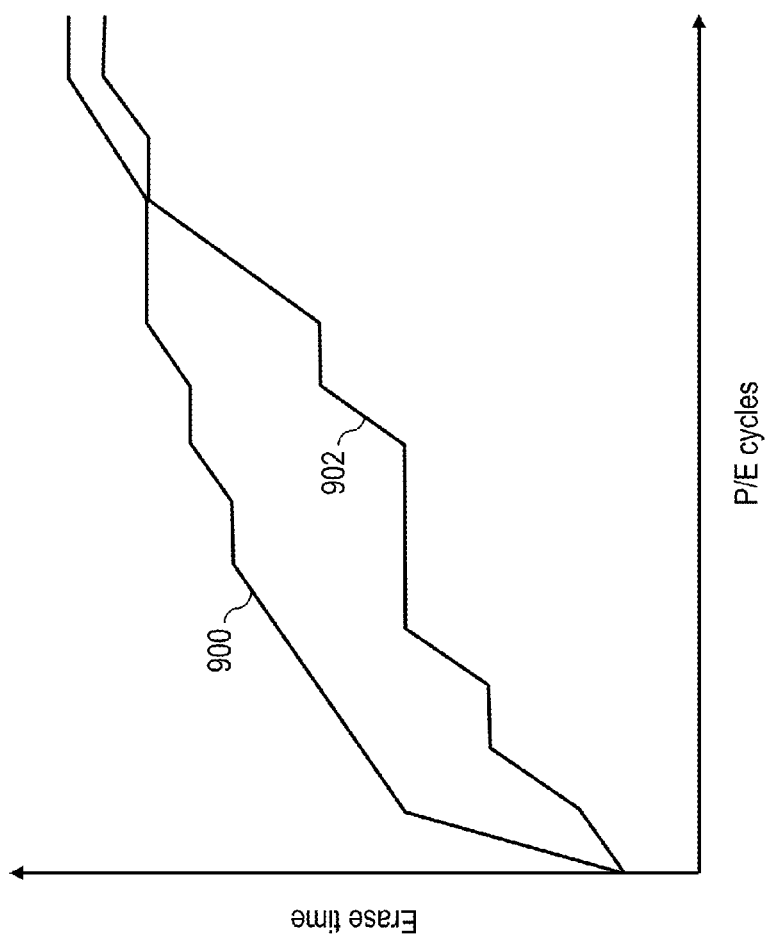
FIG. 9 is a graph illustrating the performance gain achieved in an exemplary NAND flash memory system by adapting one or more erase parameters based on P/E cycle count in accordance with one embodiment.

The graph depicted in FIG. 9 further illustrates that adapting the erase pulse budget of a block of a flash memory system based at least on a P/E cycle count as illustrated in FIG. 7 also results in an erase performance gain. In FIG. 9, P/E cycles and erase time are charted along the X and Y axes, respectively.

Curve 900 shows the erase time for a block of flash memory when a high fixed erase pulse budget (e.g., between 12-16) is employed. Curve 902 illustrates the erase time for the same block of flash memory if the erase pulse budget is adapted based on P/E cycle count, as described above with reference to FIGS. 7-8. The vertical distance, if any, between curves 900 and 902, which represents the erase performance gain attributable to adapting the erase pulse budget as the block wears, is due to the use of fewer erase pulses during erase cycles.

In at least some embodiments, adaptation of erase parameters for a block of flash memory can be based at least on a BER metric rather than, or in addition to, the P/E cycle count. Adaptation based on a BER metric can be more preferable than adaptation based solely on P/E cycle count for flash memory in which the BER characteristics of the flash memory varies greatly between blocks and/or modules, such that adaptation based on P/E cycle count alone does not provide a desired level of control of measured BERs.

Figure 10:
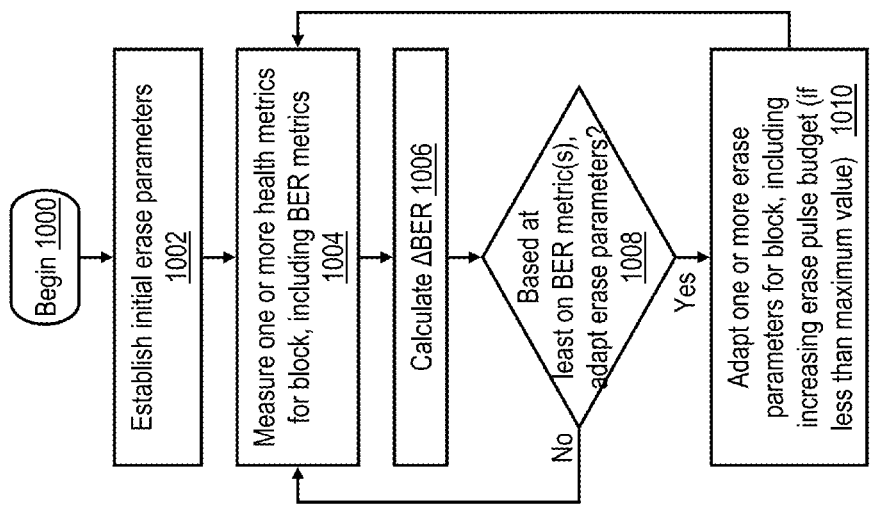
FIG. 10 is a high level logical flowchart of an exemplary process for adapting one or more erase parameters based on at least a bit error rate (BER) metric in accordance with one embodiment.

Referring now to FIG. 10, there is depicted a high level logical flowchart of an exemplary process for adapting one of more erase parameters including the erase pulse budget based on at least a BER metric in accordance with one embodiment. The illustrated process can be performed, for example, by a flash controller 140 and/or GPP 132 on a per-block basis. For ease of exposition, it is hereafter assumed that the process given in FIG. 10 is performed by flash controller 140.

The process of FIG. 10 begins at block 1000 and thereafter proceeds to block 1002, which illustrates a flash controller 140 establishing initial per-block erase parameters 220 for each flash memory module 200 under its control, for example, at system initialization. As noted above, the initial per-block erase parameters can include one or more of a set including the erase pulse budget, the amplitudes and durations of erase pulses, the erase verify voltage, and the erase verify cell count threshold. As noted above with reference to block 702, the erase parameters are preferably set to promote enhanced endurance while maintaining an acceptable BER. Consequently, at block 1002, flash controller 140 preferably sets the initial erase parameters to provide a more "gentle" erase cycle than would obtained from default erase parameters, for example, by establishing an erase pulse budget that is lower than the manufacturer-specified default, lower than default erase pulse amplitudes, a higher than default erase verify voltage threshold, and/or a higher than default erase verify cell count threshold.

Following block 1002, flash controller 140 selectively adapts one or more erase parameters 220 of a block based on at least a BER metric for the block as shown at blocks 1004-1010 of FIG. 10. In at least one embodiment, flash controller 140 (and/or GPP 132) can implement these steps as part of background health checker process 330 of FIG. 3. Referring in particular to block 1004, flash controller 140 determines one or more health metrics for the block. As described above with reference to block 704 of FIG. 7, the health metrics may include, for example, the P/E cycle count for the block as well as one or more BER metrics, such as the worst page BER of the block, the mean page BER of the block, and the rates of change of the worst page BER and mean page BER of the block. At block 1006, flash controller 140 calculates the change in BER (ΔBER), which can be computed, for example, by subtracting a previous value of the BER metric (determined during a prior iteration of the loop including blocks 1004-1010) from the current value of the BER metric. For example, in one specific example, flash controller 140 calculates ΔBER by subtracting the immediately previous value of the worst page BER for the block from the current value of the worst page BER. Because ΔBER may change non-monotonically, the calculated ΔBER may have a negative value in some cases. In these cases, flash controller 140 can use the most recently calculated positive value of ΔBER instead of the calculated negative value.

At block 1008, flash controller 140 determines whether, based at least on the BER metric(s) of the block (and optionally based on one or more additional health metrics of the block), the erase parameters should be adapted. For example, in one embodiment, flash controller 140 determines whether the sum of a current BER metric (e.g., the worst page BER) and the calculated ΔBER satisfies (e.g., is greater than) a BER adaptation threshold, which is preferably selected to be a value less than the upper BER threshold, such as the limit of error correctability via ECC.

In response to determining at block 1008 to adapt erase parameters 220 for a block, flash controller 140 adapts one or more erase parameters for the block (block 1010). In addition to increasing the erase pulse budget, flash controller 140 may also adapt the erase pulse amplitudes for future erase pulses, the erase verify voltage threshold, and/or the default erase verify cell count threshold. In general, the policy employed by flash controller 140 preferably implements a more "gentle" erase cycle (in terms of wear) early in the life of the flash module at the expense of greater BERs and thereafter adjusts the erase parameters to maintain the BER metric within desired bounds. It should be noted that the step size by which flash controller 140 adapts erase parameter(s) at block 1010 can also be adapted, for example, as a function of P/E cycles. For example, in one embodiment flash controller 140 increases the erase pulse budget by smaller step sizes at lower P/E cycle counts and by larger step sizes at higher P/E cycle counts in order to reduce erase stress early in devices' lifetimes. In another embodiment, flash controller 140 may alternatively or additionally decrease the erase verify voltage by smaller step sizes at lower P/E cycle counts and by larger steps sizes at higher P/E cycle counts in order to reduce erase stress early in devices' lifetimes. Following block 1010, the process returns to block 1004 and following blocks, which have been described.

Figure 11:
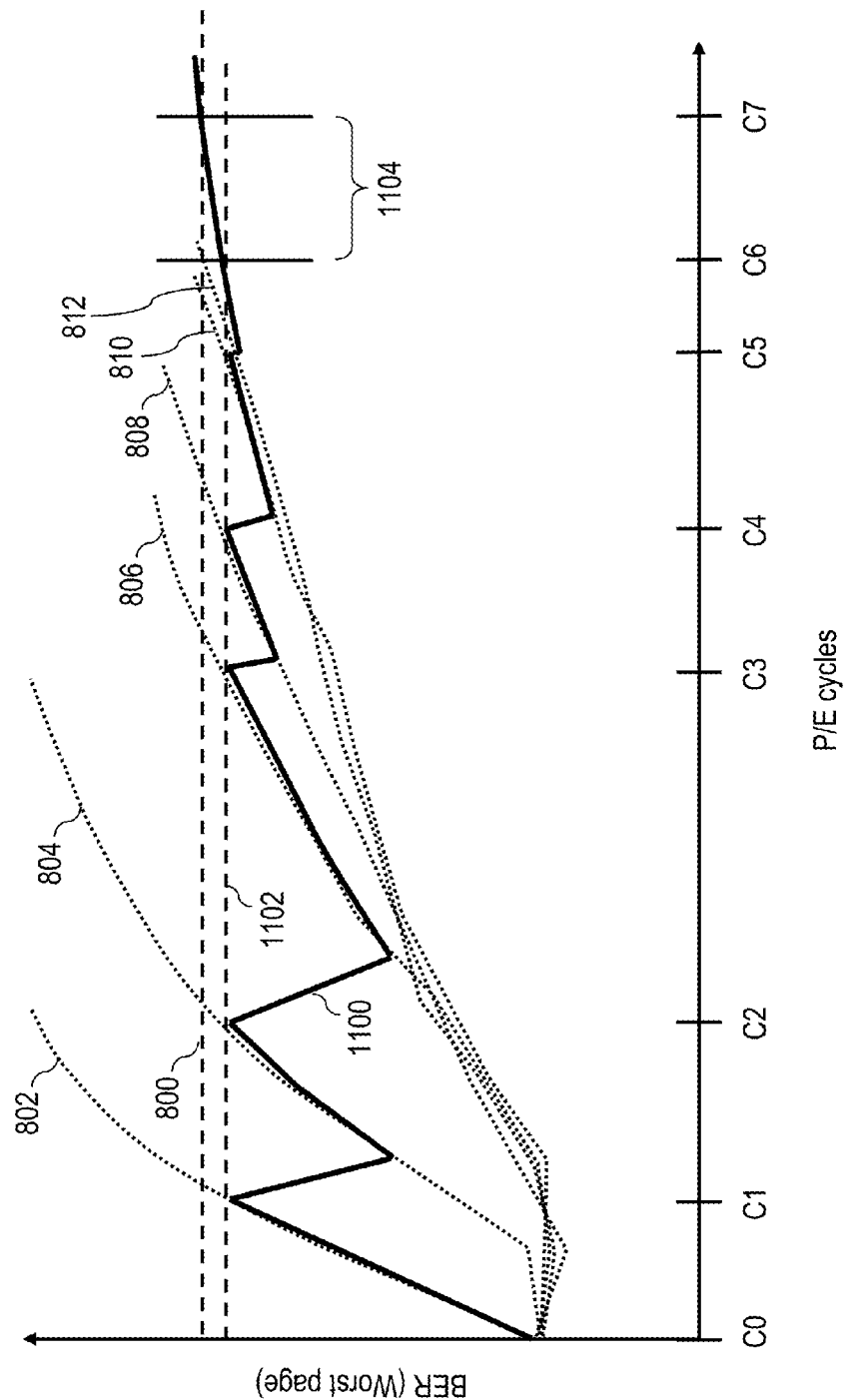
FIG. 11 is a graph depicting the endurance gain achieved in an exemplary NAND flash memory system by adapting one or more erase parameters, including the erase pulse budget, based on a BER metric in accordance with one embodiment.

With reference now to FIG. 11, a graph depicting the endurance gain achieved in an exemplary NAND flash memory system by adapting one or more erase parameters, including the erase pulse budget, based on a BER metric in accordance with one embodiment is illustrated. Like FIG. 8 described above, FIG. 11 represents P/E cycle count along the X-axis and a selected BER metric for a block (in this case, worst page BER) along the Y-axis. A similar graph would be obtained for other BER metrics, such as mean page BER.

As indicated by like reference numerals, FIG. 11 illustrates a desired upper BER threshold 800, which can represent, for example, the maximum number of bit errors that can be corrected by the ECC implemented by an exemplary flash memory module. FIG. 11 also includes curves 802-812, which, as noted above, respectively indicate the worst page BERs obtained for a block of the exemplary flash memory module for fixed erase pulse budgets of n0, n1, n2, n3, n4 and n5, respectively, where n0-n5 are positive integers and n0<n1< . . . <n5.

The method of FIG. 10 described above adapts erase parameters of a block, including at least the erase pulse budget, based on at least a BER metric, such as the worst page BER. For example, curve 1100 of FIG. 11 illustrates that the flash controller 140 initializes the erase pulse budget of a block prior to or at P/E cycle count C0 to the value of n0. The worst page BER of the block thereafter varies approximately with the P/E cycle count according to curve 802 until flash controller 140 determines that the sum of the current worst page BER and ΔBER is greater than a predetermined BER adaptation threshold 1102. Flash controller 140 then adapts the erase pulse budget by increasing the erase pulse budget from n0 to n1 at P/E cycle count C1. Consequently, the worst page BER of the block begins to approximately track curve 804 until flash controller 140 again determines that the sum of the current worst page BER and ΔBER is greater than BER adaptation threshold 1102. Flash controller 140 then adapts the erase pulse budget of the block by increasing the erase pulse budget from n1 to n2 at P/E cycle count C2. As indicated in FIG. 11, based on the worst page BER, flash controller 140 continues to adapt the erase pulse budget of the block to n3 at P/E cycle count C3, to n4 at P/E cycle count C4, and to n5 at P/E cycle count C5. Assuming in this example that the maximum possible erase pulse budget is n5, flash controller 140 preferably does not adapt the erase pulse budget after the maximum possible erase pulse budget is reached.

Although use of an adaptive erase pulse budget results in a higher initial BER metric than use of a high fixed erase pulse budget (e.g., n5), the reduced wear on the block attributable to the use of fewer total erase pulses results in a substantial improvement in the endurance of the block. For example, FIG. 11 illustrates that the worst page BER corresponding to a fixed erase pulse budget of n5 crosses upper BER threshold 800 at P/E cycle count C6, while the worst page BER obtained by adaptive control of the erase pulse budget does not cross upper BER threshold 800 until cycle C7, resulting in a substantial endurance gain 1104.

Figure 12:
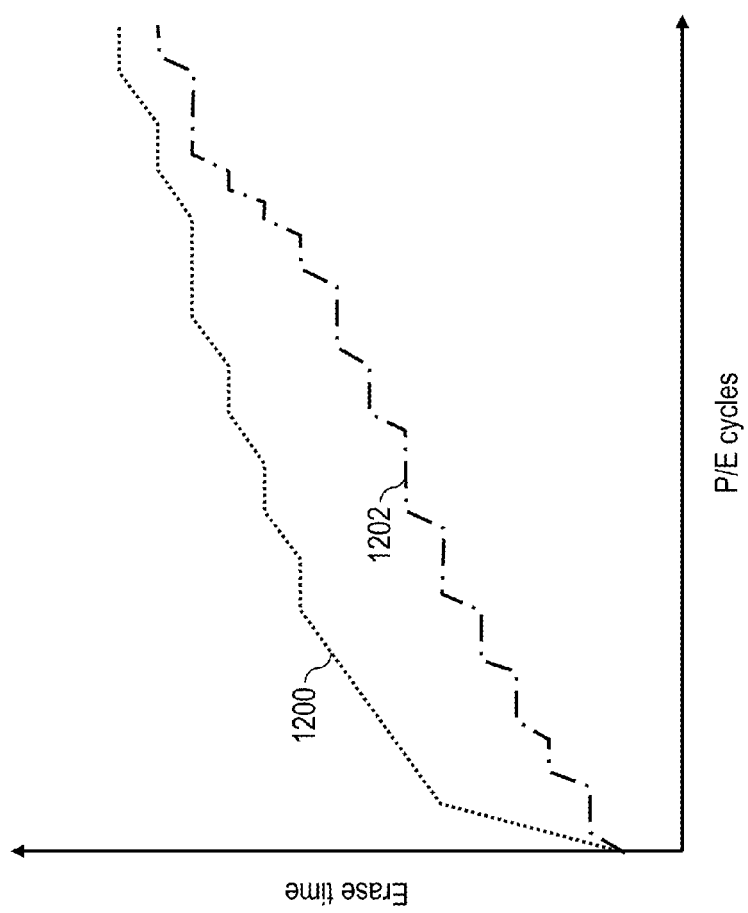
FIG. 12 is a graph illustrating the performance gain achieved in an exemplary NAND flash memory system by adapting one or more erase parameters, including the erase pulse budget, based on a BER metric in accordance with one embodiment.

The graph given in FIG. 12 illustrates that adapting an erase pulse budget of a flash memory system based at least on a BER metric as illustrated in FIGS. 10-11 also results in a gain in erase performance. Like FIG. 9, FIG. 12 represents P/E cycles and erase time along the X and Y axes, respectively.

Curve 1200 represents the erase time for a block of flash memory when a high fixed erase pulse budget (e.g., greater than n5) is employed. Curve 1202 illustrates the erase time for the same block of flash memory if the erase pulse budget is adapted based on a BER metric, as described above with reference to FIGS. 10-11. The vertical distance between curves 1200 and 1202, which represents the significant erase performance gain attributable to adapting the erase pulse budget as the block wears, is due to the use of fewer erase pulses during erase cycles.

In an alternative embodiment, the erase parameter(s) adapted at block 1010 of the process of FIG. 10 can include or can exclusively be the erase verify voltage. While adapting the erase verify voltage over the device lifetime results in similar BER behavior as adapting the erase pulse budget, adapting the erase verify voltage instead of (or in some embodiments, in addition to) the erase pulse budget offers additional benefits. For example, the erase verify voltage may offer a finer granularity of control than the erase pulse budget given the greater number of possible values. Further, adaptation of the erase verify voltage can reduce or eliminate the erase fail status, which is not possible through adaptation of the erase pulse budget alone. Further, adaptation of the erase verify voltage can be utilized to achieve significant gains in erase response time, even exceeding those obtained by adaptation of the erase pulse budget alone.

Figure 13:
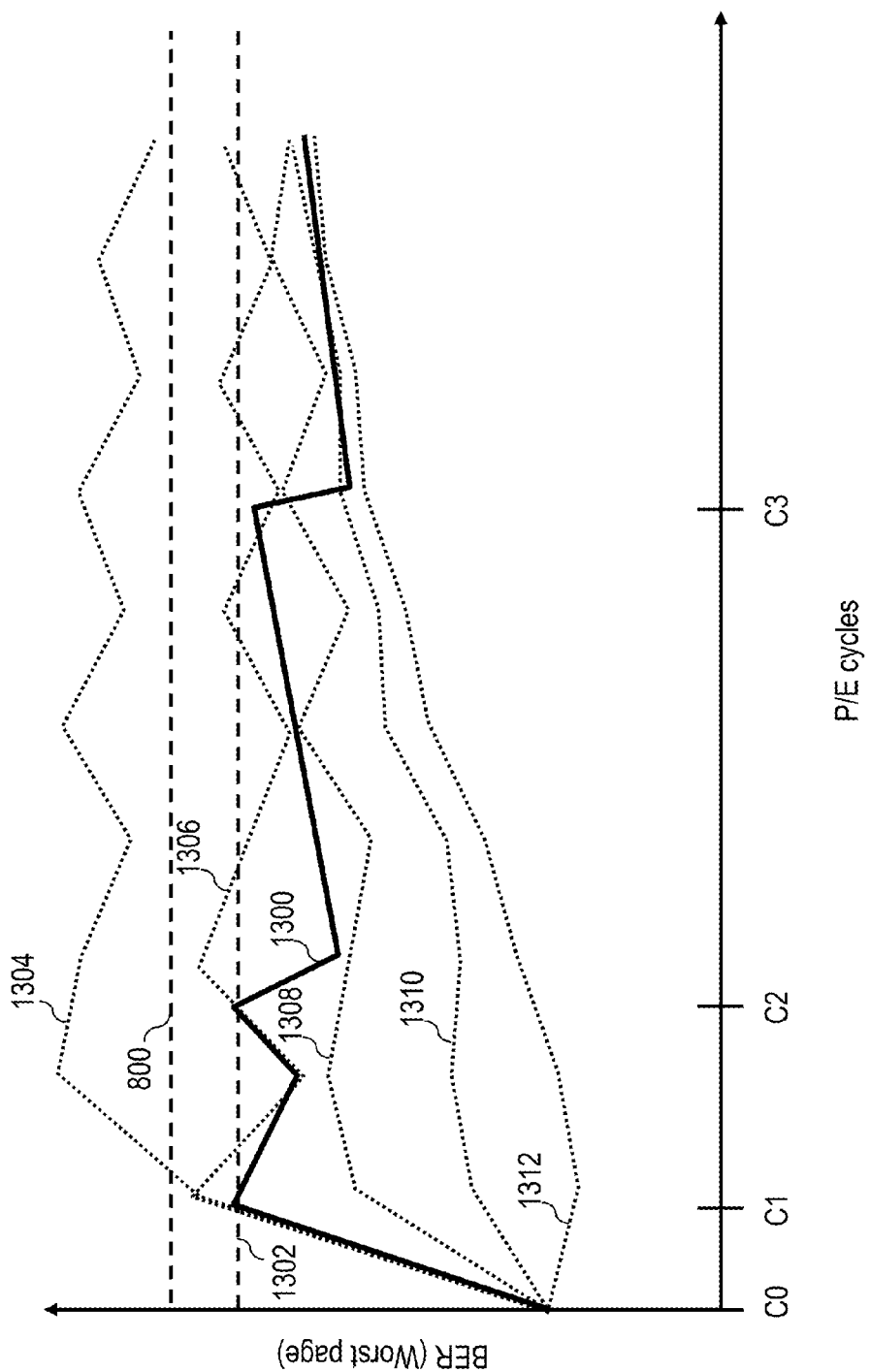
FIG. 13 is a graph depicting the endurance gain achieved in an exemplary NAND flash memory system by adapting one or more erase parameters, including the erase verify voltage, based on a BER metric in accordance with one embodiment.

With reference now to FIG. 13, a graph depicting the endurance gain achieved in an exemplary NAND flash memory system by adapting one or more erase parameters, including the erase verify voltage, based on a BER metric in accordance with one embodiment is illustrated. FIG. 13 again represents P/E cycle count along the X-axis and a selected BER metric for a block (in this case, worst page BER) along the Y-axis. A similar graph would be obtained for other BER metrics, such as mean page BER.

As indicated by like reference numerals, FIG. 13 again illustrates a desired upper BER threshold 800, which can represent, for example, the maximum number of bit errors that can be corrected by the ECC implemented by an exemplary flash memory module. In addition, FIG. 13 illustrates a BER adaptation threshold 1302, which can be the same as or different than BER adaptation threshold 1102. FIG. 13 also includes curves 1304-1312, which respectively indicate the worst page BERs obtained for a block of the exemplary flash memory module for various fixed erase verify voltages, in this case V0, V1, V2, V3, and V4, respectively, where V0<V1< . . . <V4.

In accordance with the process of FIG. 10 described above, a flash controller 140 adapts erase parameters of a block, including at least the erase verify voltage, based on at least a BER metric, such as the worst page BER. In the example given in FIG. 13, curve 1300 of FIG. 13 illustrates that the flash controller 140 initializes the erase verify voltage of a block prior to or at P/E cycle count C0 to a high initial value, such as V0. The worst page BER of the block thereafter varies approximately with the P/E cycle count according to curve 1304 until flash controller 140 determines that the sum of the current worst page BER and calculated ΔBER is greater than predetermined BER adaptation threshold 1302. Flash controller 140 then adapts the erase verify voltage by decreasing the erase verify voltage from V0 to V1 at P/E cycle count C1. Consequently, the worst page BER of the block converges toward curve 1306 until flash controller 140 again determines that the sum of the current worst page BER and calculated ΔBER is greater than BER adaptation threshold 1302. Flash controller 140 then adapts the erase verify voltage of the block by decreasing the erase verify voltage from V1 to V2 at P/E cycle count C2. As indicated in FIG. 13, based on the worst page BER, flash controller 140 also adapts the erase verify voltage of the block to V3 at P/E cycle count C3. Assuming in this example that the minimum possible erase verify voltage is V4, flash controller 140 preferably does not adapt the erase verify voltage after the minimum possible erase verify voltage is reached.

Although use of an adaptive erase verify voltage results in a higher initial BER metric than use of a lower fixed erase verify voltage (e.g., V4), the reduced wear on the block attributable to the use of fewer total erase pulses results in a substantial improvement in the endurance of the block. Further, as noted above, the adaption of the erase verify voltage results in substantial gains in erase performance.

Figure 14:
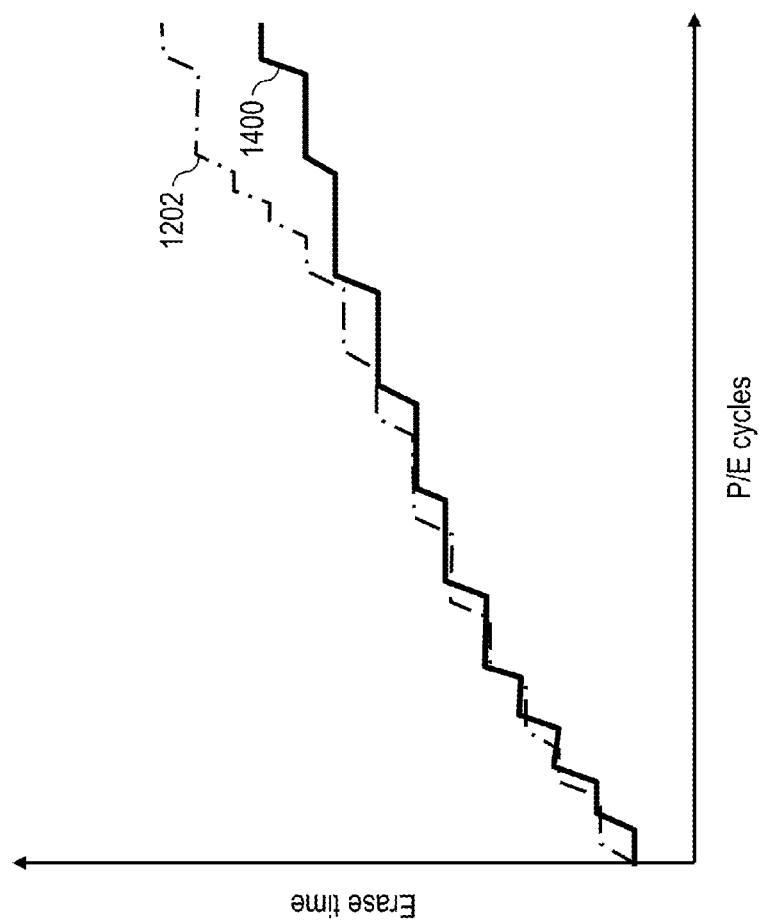
FIG. 14 is a graph illustrating the performance gain achieved in an exemplary NAND flash memory system by adapting one or more erase parameters, including the erase verify voltage, based on a BER metric in accordance with one embodiment.

Referring now to FIG. 14, a graph is given that illustrates the erase performance gains attributable to adaptation of an erase verify voltage of a flash memory system based at least on a BER metric. Like FIGS. 9 and 12, FIG. 14 represents P/E cycles and erase time along the X and Y axes, respectively.

As noted above with reference to FIG. 12, curve 1202 represents the erase time for a block of flash memory if the erase pulse budget is adapted based on a BER metric. Curve 1400 represents the erase time over P/E cycles if the erase verify voltage is instead adapted based on the BER metric as described above with reference to FIGS. 10 and 13. The vertical distance between curves 1202 and 1400 represents the additional erase performance gain attributable to adapting the erase verify voltage, particularly as P/E cycles increase. Again, this performance gain is obtained through the use of relative fewer erase pulses during erase cycles as the block wears.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, in at least one embodiment, in a data storage system including a non-volatile memory array, a controller repeatedly determines at least one health metric of the non-volatile memory array during an operating lifetime of the non-volatile memory array. In response to determining the at least one health metric, the controller selectively varies an erase parameter (e.g., an erase pulse budget, an erase verify voltage threshold for an erase verify operation, a threshold memory cell count for the erase verify operation, an erase pulse amplitude, and/or an erase pulse duration) of the non-volatile memory array over the operating lifetime of the non-volatile memory array, such that endurance of the non-volatile memory array is improved The at least one health metric upon which the adaptation depends can include a BER metric and/or a P/E cycle count.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating media per se.

In addition, although embodiments have been described that include use of a NAND flash memory, it should be appreciated that embodiments of the present invention can also be used with any other type of non-volatile random access memory (NVRAM) that requires block-erase before page programming.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method in a data storage system including a non-volatile memory array controlled by a controller, the method comprising:
   selecting and implementing a first value among a plurality of alternative values as a value of an erase parameter of the non-volatile memory, wherein the selecting includes selecting the first value such that a bit error rate for the non-volatile memory array is greater than that which would be achieved if a second value among the plurality of alternative values for the erase parameter were selected;
   thereafter, during an operating lifetime of the non-volatile memory array, the controller repeatedly determining at least one health metric of the non-volatile memory array, wherein the at least one health metric includes one based on the bit error rate; and
   in response to the determining of the at least one health metric, the controller selectively varying the value of the erase parameter of the non-volatile memory array over the operating lifetime of the non-volatile memory array such that the bit error rate is controlled in accordance with a bit error rate threshold greater than the bit error rate, wherein endurance of the non-volatile memory array is improved.

2. The method of claim 1, wherein:
   the non-volatile memory array includes multiple blocks of memory; and
   the controller performs the selectively varying the erase parameter on a per-block basis.

3. The method of claim 1, wherein the at least one health metric comprises a program/erase cycle count.

4. The method of claim 1, wherein the at least one health metric comprises a bit error rate.

5. The method of claim 4, wherein:
   the non-volatile memory array includes multiple blocks of memory; and
   the bit error rate comprises a worst page bit error rate for one of the blocks of memory.

6. The method of claim 4, wherein the at least one health metric further includes a change in the bit error rate.

7. The method of claim 1, wherein the bit error rate threshold is related to a maximum number of errors that can be corrected by an error correcting code implemented for the non-volatile memory array.

8. The method of claim 1, wherein the selectively varying includes selectively varying at least one erase parameter from a set including an erase pulse budget, an erase verify voltage threshold for an erase verify operation, a threshold memory cell count for the erase verify operation, an erase pulse amplitude, and an erase pulse duration, wherein the erase pulse budget specifies a maximum number of erase pulses that can be used in any given erase operation to which the erase pulse budget applies.

9. The method of claim 1, wherein:
   the erase parameter is the erase verify voltage threshold; and
   the first value is a higher erase verify voltage threshold and the second value is a lower erase verify voltage threshold.

10. The method of claim 1, wherein:
    the erase parameter is the erase pulse budget; and
    the first value is a lower erase pulse budget and the second value is a higher erase pulse budget.

11. The method of claim 1, wherein the selectively varying includes selectively varying the value of the erase parameter such that the bit error rate has a highest possible value less than the bit error rate threshold.

12. A data storage system, comprising:
a controller configured to be coupled to a non-volatile memory array, wherein the controller selects and implements a first value among a plurality of alternative values as a value of an erase parameter of the non-volatile memory such that a bit error rate for the non-volatile memory array is greater than that which would be achieved if a second value among the plurality of alternative values for the erase parameter were selected, and wherein the controller, thereafter during an operating lifetime of the non-volatile memory array, repeatedly determines at least one health metric of the non-volatile memory array including one based on the bit error rate, and in response to determining the at least one health metric, selectively varies the value of the erase parameter of the non-volatile memory array over the operating lifetime of the non-volatile memory array such that the bit error rate is controlled in accordance with a bit error rate threshold greater than the bit error rate and endurance of the non-volatile memory array is improved.

13. The data storage system of claim 12, wherein:
the non-volatile memory array includes multiple blocks of memory; and
the controller selectively varies the erase parameter on a per-block basis.

14. The data storage system of claim 12, wherein the at least one health metric comprises a program/erase cycle count.

15. The data storage system of claim 12, wherein the at least one health metric comprises a bit error rate.

16. The data storage system of claim 15, wherein:
the non-volatile memory array includes multiple blocks of memory; and
the bit error rate comprises a worst page bit error rate for one of the blocks of memory.

17. The data storage system of claim 15, wherein the at least one health metric further includes a change in the bit error rate.

18. The data storage system of claim 12, wherein the bit error rate threshold is related to a maximum number of error that can be corrected by an error correcting code implemented for the non-volatile memory array.

19. The data storage system of claim 12, wherein the controller selectively varies at least one erase parameter from a set including an erase pulse budget, an erase verify voltage threshold for an erase verify operation, a threshold memory cell count for the erase verify operation, an erase pulse amplitude, and an erase pulse duration, wherein the erase pulse budget specifies a maximum number of erase pulses that can be used in any given erase operation to which the erase pulse budget applies.

20. The data storage system of claim 12, and further comprising the non-volatile memory array coupled to the controller.

21. A program product, comprising:
a storage device; and
program code stored in the storage device, wherein the program code, when executed by a controller that controls a non-volatile memory array of a data storage system, causes the controller to perform:
selecting and implementing a first value among a plurality of alternative values as a value of an erase parameter of the non-volatile memory, wherein the selecting includes selecting the first value such that a bit error rate for the non-volatile memory array is greater than that which would be achieved if a second value among the plurality of alternative values for the erase parameter were selected;
thereafter, during an operating lifetime of the non-volatile memory array, the controller repeatedly determining at least one health metric of the non-volatile memory array, wherein the at least one health metric includes one based on the bit error rate; and
in response to the determining of the at least one health metric, the controller selectively varying the value of the erase parameter of the non-volatile memory array over the operating lifetime of the non-volatile memory array such that the bit error rate is controlled in accordance with a bit error rate threshold greater than the bit error rate, wherein endurance of the non-volatile memory array is improved.

22. The program product of claim 21, wherein:
the non-volatile memory array includes multiple blocks of memory; and
the controller performs the selectively varying the erase parameter on a per-block basis.

23. The program product of claim 21, wherein the at least one health metric comprises a program/erase cycle count.

24. The program product of claim 21, wherein the at least one health metric comprises a bit error rate.

25. The program product of claim 21, wherein the selectively varying includes selectively varying at least one erase parameter from a set including an erase pulse budget, an erase verify voltage threshold for an erase verify operation, a threshold memory cell count for the erase verify operation, an erase pulse amplitude, and an erase pulse duration, wherein the erase pulse budget specifies a maximum number of erase pulses that can be used in any given erase operation to which the erase pulse budget applies.

* * * * *